United States Patent [19]

Bull

[11] 3,778,813

[45] Dec. 11, 1973

[54] REMOTE CONTROL ARRANGEMENT

[75] Inventor: Ivor Henry Bull, London, England

[73] Assignee: Westinghouse Brake and Signal Company Limited, London, England

[22] Filed: Sept. 10, 1971

[21] Appl. No.: 179,596

Related U.S. Application Data

[63] Continuation of Ser. No. 653,812, July 17, 1967.

[30] Foreign Application Priority Data

Aug. 5, 1966 Great Britain .................. 35,121/66

[52] U.S. Cl. .............................. 340/347 DD, 303/20

[51] Int. Cl. .......................................... H03k 13/00

[58] Field of Search ........................ 340/347; 303/20

[56] References Cited

UNITED STATES PATENTS

| | | | |
|---|---|---|---|
| 2,876,444 | 3/1959 | Moss | 340/347 |
| 3,374,035 | 3/1968 | Howard | 303/20 |
| 2,934,754 | 4/1960 | Jackel | 340/347 |

*Primary Examiner*—Charles D. Miller
*Attorney*—Larson and Taylor

[57] ABSTRACT

A digital code converter for use with a vehicle braking system of the type wherein a controller, by its movement, energizes selected ones of a set of ordered electrical conductors. The described conversion is of gray to binary type.

1 Claim, 1 Drawing Figure

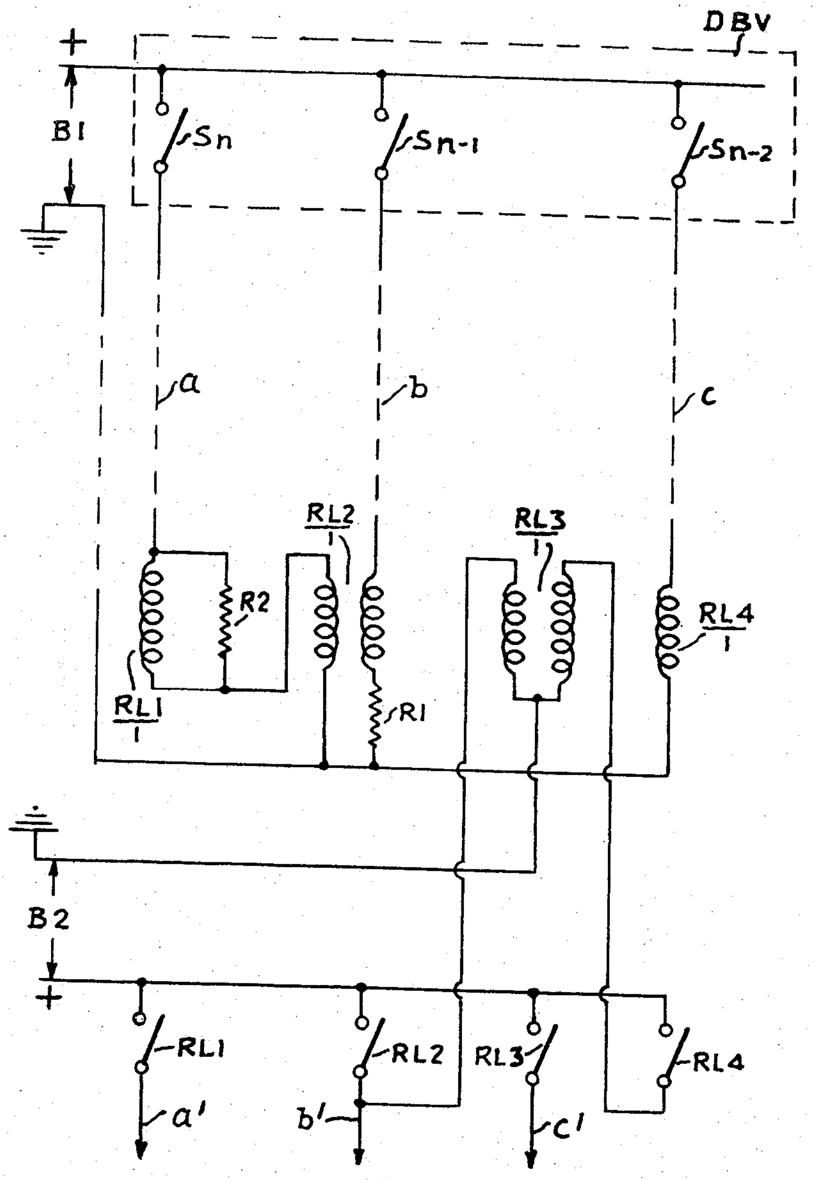
DBV
+
B1
Sn
Sn-1
Sn-2
a
b
c
RL2
1
RL3
1
R2
RL4
1
RL1
1
R1
B2
+
RL1
RL2
RL3
RL4
a'
b'
c'

REMOTE CONTROL ARRANGEMENT

This is a continuation, of application Ser. No. 653,812 filed July 17, 1967.

This invention relates to remote control arrangements.

There has been previously proposed a remote control arrangement comprising means for producing an output signal having a progressively variable force step characteristic by the application to said means of an input signal, the character of which is variable by the selective electrical energisation of a combination of a plurality of leads, each combination of leads so energised being unique to a step in the progressive variation of the character of the output signal and further comprising electrical switching means whereby any required combination of leads can be energised, said switching means being operable step-wise, one switching operation corresponding to one step in the progressive variation in the character of the output signal such that in progressing from one step in the operation of said switching means to the next successive step, only a single additional lead is energised or a single lead already energised is de-energised to achieve the combination of energised leads characteristic of the step in the progressive variation of the output signal corresponding to said next successive step in the operation of the switching means. Such a control arrangement will hereinafter be referred to as "of the type described."

According to the present invention, there is provided a remote control arrangement of the type described in which the leads are coupled as input leads to a digital code conversion arrangement having an output lead for each of said input leads and which includes relays each arranged to be energised by electrical energisation of a corresponding one of the input leads such energisation being complemented in each case in operation by energisation of the output lead corresponding to the digit of the next highest order of significance.

The output leads may be energized via the respective relays from a supply distinct from the supply to the input leads, and, for a relay corresponding to one digit energisation of which is required to be counteracted by energisation of an output lead corresponding to the digit of the next highest order there may be provided a further relay whereby inputs to the former relay are mutually counteracting independently of relative voltage differences between the supplies.

Each relay, other than the relay corresponding to the digit of the highest order, has two windings, one connected to the corresponding input lead, the other being connected with opposite polarity and operative in response to the energisation of the output lead corresponding to the digit of the next highest order of significance.

The invention will now be further described, by way of example, with reference to the accompanying drawing.

The remote control arrangement described is a remote control arrangement for the control of a braking force actuator and it consists basically of a driver's brake valve incorporating a controller switching unit DBV which includes switches which are operated to produce a change in the state of the energisation of only one output lead for each step of the driver's brake valve. The combination of energisation of the leads is, therefore, representative in digital code form of the brake pressure which is required to be applied to a suitable force actuator. However, the form of this code is not suitable for direct application to the means for operating the force actuator and a suitable code conversion is required to convert this digital code into a pure binary code. For this purpose a contactor unit is provided having a number of energisable windings connected to the leads of the driver's brake valve switching unit and relatively complex banks of contactors so associated with the energising windings as to provide the requisite code conversion.

When the apparatus is used in a railway brake system as described above, if the code conversion is performed at the driver's brake valve, the source of supply is the source on the driving car. However, if conversion is performed at each brake unit, the code to be converted being transmitted down the train wires to the various brake units, the energisation on the output leads may be required to be derived from the local battery source and voltage discrepancies are therefore likely to arise as between the energised voltage of the train wires and the energised voltage on the output leads. By providing said further relay, however, this difficulty may be overcome.

Referring to the drawing, the driver's brake valve is represented as DBV and this includes a switching unit including switches Sn, Sn-1 and Sn-2, in decreasing order of significance of the code represented by energisation of the wires *a*, *b* and *c*, carrying the code to be converted. These wires are now the train wires and constitute leads to a code conversion arrangement for each brake unit, only one conversion arrangement being shown. The train wire *a* is connected to a terminal of the energising coil of the relay of highest order of significance, namely relay RL1/1 and this relay has a winding of the next relay RL2/1 connected in series with it back to the return wire for the system. The relay RL2 has a second energising winding which is connected between the train wire *b* and the return wire, a suitable ballast resistance R1 being connected in series therewith. A further ballast resistance R2 is connected across the winding of the relay RL1/1. The train wire *c* is connected to the single winding of a further relay RL4/1 the other terminal of which is connected to the return wire.

All of the relays RL1/1, RL2/1 and RL4/1 are energised by the source B1 which is provided on the driver's car. A further source B2 is provided on the car carrying the braking apparatus under consideration and the contact of relay RL4 when closed provides a circuit path from this source to one winding of a relay RL3/1. The contacts of relay RL1, RL2 and RL3 when closed provide respective energised outputs on the output leads *a*, *b* and *c*, respectively, these outputs being again derived from the local source B2. Again, a further winding on the relay RL3/1 is energised in the closed position of relay RL2 again from the local source B2.

Considering now the manner of operation of the code conversion arrangement, the code to be converted is a so-called Gray code and the law for conversion of this code to a pure binary code consists basically of complementing any digit in the code applied to the conversion apparatus when the converted digit of the next highest order in the code is a 1. It will be seen therefore that complementing of the digit represented by energisation or otherwise of the train wire *b* is affected on energisation of the train wire *a* by virtue of the winding on the relay RL2/1 which is connected in series with the relay RL1/1. In the case of the train wire *b* being energised, this series winding has the effect of cancelling the energisation of the relay RL2/1 and the contacts of this relay, namely RL2, remain open. However, if the train wire *b* is unenergised, complementing has the effect of the energisation produced by *a* alone and the contacts of RL2 are closed. Clearly, if *a* is not energised, *b* is not complemented.

The function of the resistors R1 and R2 associated with the windings of relays RL1/1 and RL2/1 is to provide suitable balancing between the energisation of these relays such that the energisation of the train wire *a* can balance the energisation of the train wire *b*, notwithstanding that the train wire *a* feeds two relays in series.

Considering the complementing of the digit of lowest order of significance, namely that represented by the energisation or otherwise of the train wire *c*, this complementing is effected directly by a cross feed from the output lead *b'* of the conversion arrangement, which it will be recalled, is energised from the local supply source B2. Energisation of the train wire *c* has the effect of energising the relay RL4 and thereby closing the contacts RL4 of this relay to provide a current path from the local source B2 through one winding of the relay RL3/1. In the event of the output lead B' of the conversion arrangement being energised, this energisation is applied to the other winding of the relay winding RL3/1 and since the voltages with which the two windings of RL3/1 are energised are substantially equal, being derived from the same source, these energisations mutually cancel and the contacts of relay RL3 remain open. The output lead *c'* of the conversion arrangement is therefore not energised, and the digit of lowest order of significance has therefore been complemented. Clearly, energisation of one of the windings only, of relay RL3/1, corresponding either to no energisation of the train wire *c*, or no energisation of the output lead *b'* of the conversion arrangement leads to closing of the contacts RL3, and therefore energisation of the output lead *c'* of the conversion arrangement.

By virtue of the fact that energisation of the input line *c* of the conversion apparatus from the source B1 gives rise via the further relay RL4 to energisation of the relay RL3/1 by the local source B2, it will be appreciated that cancellation of this by energisation of the output lead *b'* of the conversion arrangement can be effected to provide reliable complementing regardless of deviation between the voltages of the sources B1 and B2.

Whilst the circuit arrangement shown is a conversion arrangement for three-digit conversion, clearly the invention may be really applied to conversion arrangements for greater number of digits, in which case additional further relays such as RL4 may be provided.

I claim:

1. In a railway vehicle brake system, (*a*) a brake controller movable to distinct positions representing different, graded, degrees of braking required and connected to a first electrical battery supply and a first set of ordered electrical conductors each of which is selectively either energizable or de-energizable from said first battery supply one at a time upon movement of the control means from one distinct position to the next distinct position so that the energisation state of the first set of conductors represents the degree of braking required at the next distinct position, (*b*) a plurality of gray to binary converters respectively located at individual ones of a corresponding plurality of railway vehicles, each said converter being connected to said first set of conductors, to a further, individual electrical battery supply on the corresponding vehicle and to a second corresponding set of ordered electrical conductors each of which is either energizable of de-energizable from said second supply by the operation of the converter so that each distinct position of the controller the energization condition of the most significant conductor of each set is that of the most significant of the first, and the energization of each conductor of lesser significance of the second set is the energization condition of the respective conductor of the first unless the next most significant conductor of the second set is in a designated energization condition, and (*c*) brake application means individual to each said railway vehicle each said brake application means including an actuator for each conductor of the corresponding second set for exerting a brake application force corresponding to the significance of the respective conductor, each said converter including a first repeated relay for each conductor causing the same state of energization or de-energization of the conductor of the same significance of the second set from the second electrical supply as the controller causes in each conductor of the first set and a second relay for each conductor of the first set other than the most significant having two windings energizable in opposition, the relay of the most significant conductor having a single winding with a resistor in parallel therewith one by the conductor of said lesser significance of the first set through the first relay and the other by the next most significant conductor of the second set.

* * * * *